(12) United States Patent
Bandic et al.

(10) Patent No.: US 10,175,890 B2
(45) Date of Patent: Jan. 8, 2019

(54) NON-BINARY ECCS FOR LOW LATENCY READ, FRACTIONAL BITS PER CELL OF NAND FLASH

(71) Applicant: Western Digital Technologies, Inc., Irvine, CA (US)

(72) Inventors: Zvonimir Z. Bandic, San Jose, CA (US); Kiran Kumar Gunnam, Milpitas, CA (US); Minghai Qin, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 43 days.

(21) Appl. No.: 15/388,623

(22) Filed: Dec. 22, 2016

(65) Prior Publication Data
US 2018/0181317 A1    Jun. 28, 2018

(51) Int. Cl.
  *G06F 3/06*      (2006.01)
  *G06F 11/10*     (2006.01)
  *G11C 29/52*     (2006.01)

(52) U.S. Cl.
  CPC .......... *G06F 3/0611* (2013.01); *G06F 3/064* (2013.01); *G06F 3/0619* (2013.01); *G06F 3/0659* (2013.01); *G06F 3/0679* (2013.01); *G06F 11/1072* (2013.01); *G11C 29/52* (2013.01)

(58) Field of Classification Search
  CPC .... G06F 11/1072; G06F 3/0619; G06F 3/064; G06F 3/0659; G06F 3/30611; G06F 3/0611; G06F 3/0679; G11C 16/26; G11C 16/04; G11C 16/3454; G11C 29/52
  See application file for complete search history.

(56) References Cited

U.S. PATENT DOCUMENTS

| | | | |
|---|---|---|---|
| 8,482,977 B2 * | 7/2013 | Kim | G11C 16/04 365/185.03 |
| 8,644,067 B2 | 2/2014 | Jeon | |
| 8,677,215 B2 | 3/2014 | Ramamoorthy et al. | |
| 8,767,459 B1 | 7/2014 | Kasorla et al. | |
| 8,954,820 B2 | 2/2015 | Nemati Anaraki et al. | |

(Continued)

OTHER PUBLICATIONS

Vakilinia, et al.; Optimized Degree Distributions for Binary and Non-Binary LDPC Codes in Flash Memory; Information Theory and its Applications (ISITA); dated 2014; 1 page.

(Continued)

*Primary Examiner* — Shelly A Chase
(74) *Attorney, Agent, or Firm* — Vierra Magen Marcus LLP

(57) ABSTRACT

The present disclosure generally relates to methods of reading data from a memory device using non-binary ECCs. The memory device includes multiple memory cells where each memory cell has multiple pages that are arranged in distinct layouts for physical addresses thereof. When a read request is received from a host device to obtain data from a specific page of a specific memory cell of a memory device, rather than reading the data from all pages of the memory cell, the data can be read from just the desired page and then decoded. Following decoding, the data can be delivered to the host device. Because only the data from a specific page of a memory cell is read, rather than the entire memory cell, the read latency is reduced when compared to reading the entire memory cell.

21 Claims, 14 Drawing Sheets

(56) References Cited

U.S. PATENT DOCUMENTS

| | | |
|---|---|---|
| 8,964,465 B2 | 2/2015 | Radke |
| 9,280,456 B2 | 3/2016 | Varanasi |
| 9,337,864 B1 | 5/2016 | Vakilinia et al. |
| 2013/0145235 A1* | 6/2013 | Alhussien ............ G06F 11/1008 714/773 |
| 2015/0339186 A1* | 11/2015 | Sharon ............... H03M 13/1108 714/760 |

OTHER PUBLICATIONS

Zhao, et al.; On the Case of Using Aggregated Page Programming for Future MLC NAND Flash Memory; Circuits, Systems, and Signal Processing; vol. 34, Issue 2; dated Aug. 12, 2014; 6 total pages.

Kaynak, et al.; Bit Interleaved Coded Modulation to Enable Fractional Bits-Per-Cell Storage at NAND Flash Memory; International Journal of Electronics and Communications; vol. 70; Issue 5; dated May 2016; 1 page.

* cited by examiner

NON-BINARY ECCS FOR LOW LATENCY READ, FRACTIONAL BITS PER CELL OF NAND FLASH

BACKGROUND OF THE DISCLOSURE

Field of the Disclosure

Embodiments of the present disclosure generally relate to methods of reading data from a memory device using non-binary error correction codes (ECCs).

Description of the Related Art

Non-volatile devices, such as flash memory based solid-state drive (SSD) devices having NAND flash memory, have become the preferred technology for many applications in recent years. The ability to store large amounts of data and to withstand a harsh operating environment, together with the non-volatile nature of the storage, makes these flash storage devices appealing for many applications.

Multiple-level cell technology has been utilized in NAND flash to lower cost per unit of storage by increase data density. Unlike a single-level cell (SLC) flash NAND memory, which can store one bit per cell, multiple-level cell flash NAND memory can store multiple bits per cell. For example, a multi-level cell (MLC) flash NAND memory can store two bits per cell, a triple-level cell (TLC) flash NAND memory can store three bits per cell, and a quad-level cell (QLC) flash NAND memory can store four bits per cell.

When a read request is received from a host device, the memory cell is read and decoded, and then the read results are delivered to the host device. The entire memory cell is read and thus, due to the multiple levels in the memory cell, leads to an undesirable read latency.

What is needed in the art is a method to reduce read latency in multiple level memory cells.

SUMMARY OF THE DISCLOSURE

The present disclosure generally relates to methods of reading data from a memory device using non-binary ECCs. The memory device includes multiple memory cells where each memory cell has multiple pages that are arranged in distinct layouts for physical addresses thereof. When a read request is received from a host device to obtain data from a specific page of a specific memory cell of a memory device, rather than reading the data from all pages of the memory cell, the data can be read from just the desired page and then decoded. Following decoding, the data can be delivered to the host device. Because only the data from a specific page of a memory cell is read, rather than the entire memory cell, the read latency is reduced when compared to reading the entire memory cell.

In one embodiment, a method comprises: receiving a read request at a memory device from a host device that is coupled to the memory device, wherein the memory device is a multiple level storage device having a plurality of memory cells and wherein each memory cell has a plurality of pages with each page corresponding to a different level of the multiple level storage device; determining that the read request involves reading information from less than all pages of a first memory cell; reading information from less than all pages of the first memory cell; decoding the read information using non-binary error correction codes (ECCs); and delivering the decoded information to the host device.

In another embodiment, a computer system for storing and retrieving data comprises: a processor; and a memory storing instructions that, when executed by the processor, cause the computer system to: receive a read request at a memory device from a host device that is coupled to the memory device, wherein the memory device is a multiple level storage device having a plurality of memory cells and wherein each memory cell has a plurality of pages with each page corresponding to a different level of the multiple level storage device; determine that the read request involves reading information from less than all pages of a first memory cell; read information from less than all pages of the first memory cell; decode the read information using non-binary error correction codes (ECCs); and deliver the decoded information to the host device.

In another embodiment, a non-transitory computer readable storage medium is disclosed that contains instructions that, when executed by a processor, performs the following method: receive a read request at a memory device from a host device that is coupled to the memory device, wherein the memory device is a multiple level storage device having a plurality of memory cells and wherein each memory cell has a plurality of pages with each page corresponding to a different level of the multiple level storage device; determine that the read request involves reading information from less than all pages of a first memory cell; read information from less than all pages of the first memory cell; decoding the read information using non-binary error correction codes (ECCs); and deliver the decoded information to the host device.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods of reading data from a memory device using non-binary ECCs. The memory device includes multiple memory cells where each memory cell has multiple pages that are arranged in distinct layouts for physical addresses thereof. When a read request is received from a host device to obtain data from a specific page of a specific memory cell of a memory device, rather than reading the data from all pages of the memory cell, the data can be read from just the desired page and then decoded. Following decoding, the data can be delivered to the host device. Because only the data from a specific page of a memory cell is read, rather than the entire memory cell, the read latency is reduced when compared to reading the entire memory cell.

Figure 1:
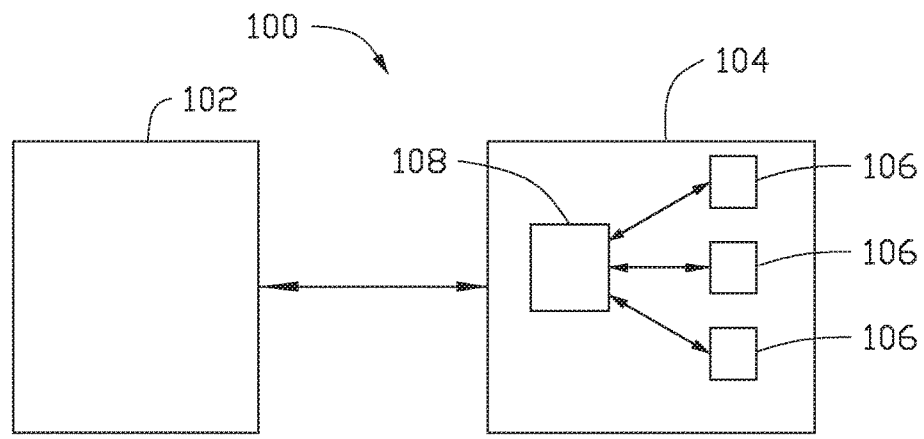
FIG. 1 is a schematic illustration of a computer system according to one embodiment.

FIG. 1 is a schematic illustration of a computer system 100 according to one embodiment. The computer system 100 has a host device 102 that requests data to be written to and read from a memory system 104. The memory system 104 has numerous memory devices 106. The memory devices 106 communicate with a scheduler 108 that communicates with the host device 102. The scheduler 108 determines which memory device 106 to read from or write to, receives the read/write request from the host device 102 and delivers the read data (or write confirmation) to the host device 102 from the memory system 104. In one embodiment, the memory devices 106 are NAND Flash memory devices.

Figure 2A:
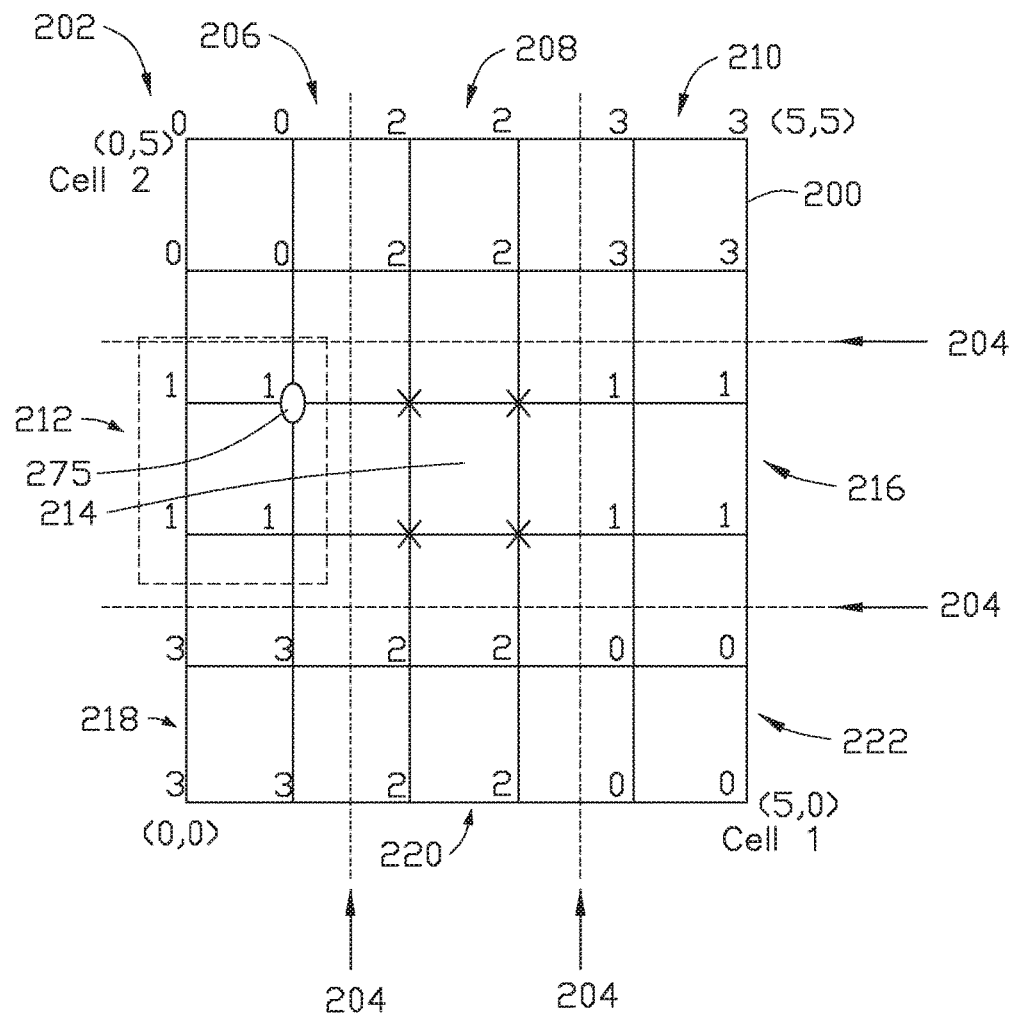
FIG. 2A is a schematic illustration of a first page of a six level memory device according to one embodiment.
Figure 2B:
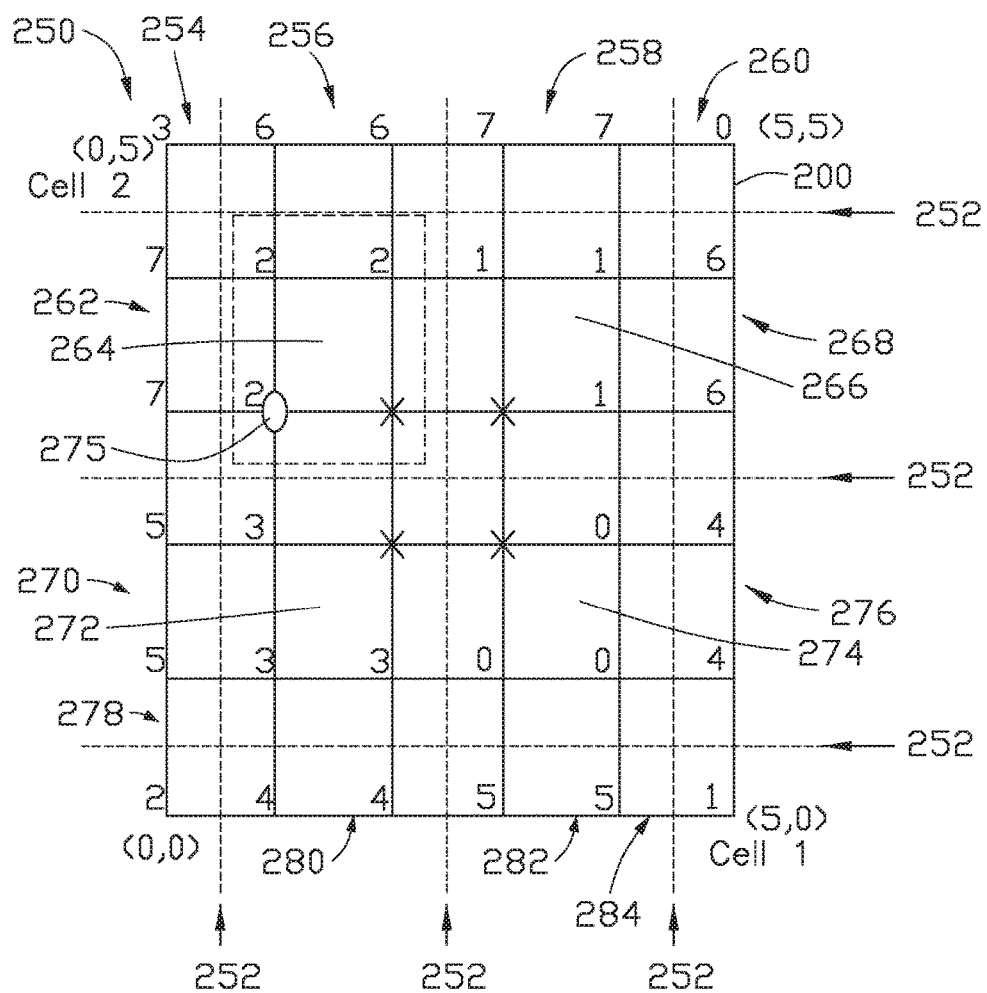
FIG. 2B is a schematic illustration of a second page of the six level memory device of FIG. 2A.
Figure 2C:
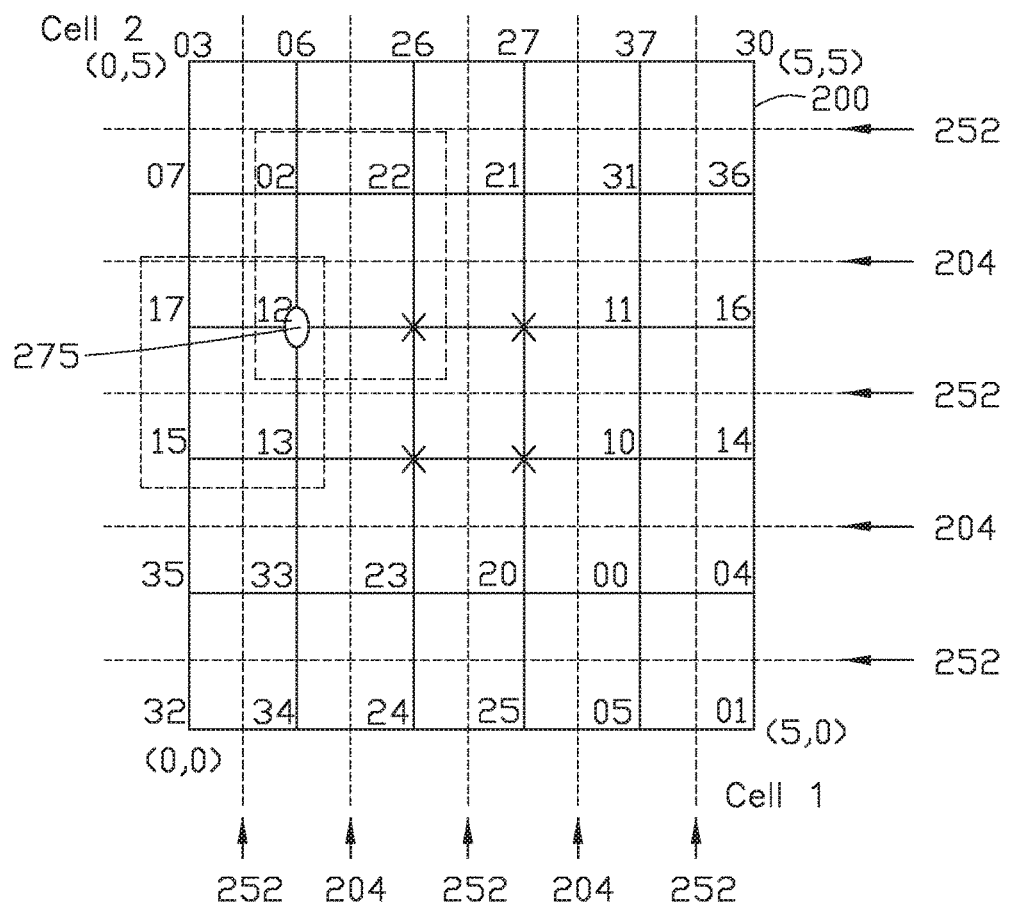
FIG. 2C is a schematic illustration of the six level memory device of FIGS. 2A and 2B with both pages.

FIG. 2A is a schematic illustration of a first page 202 of a six level memory device 200 according to one embodiment. FIG. 2B is a schematic illustration of a second page 250 of the six level memory device 200 of FIG. 2A. FIG. 2C is a schematic illustration of the six level memory device 200 of FIGS. 2A and 2B with both pages. As can be seen in FIG. 2A, the first page 202 has a physical layout of a 6×6 grid with two cells. The first page 202 has 4 possible symbols (i.e., 0, 1, 2 or 3). As will be discussed below with regards to FIG. 2B, the second page 250 has 8 possible symbols (i.e., 0, 1, 2, 3, 4, 5, 6 or 7). Thus, there are 36 points for the memory device 200. While there are 36 points, there are only 32 possible points to use because the number of possible points equals the number of possible symbols for the first page times the number of possible symbols for the second page. Therefore, four point locations are not utilized on the first page 202 or second page 250. The non-used locations correspond to the same physical location identified by an "X" on FIGS. 2A-2C.

The first page 202 has been divided into 9 areas that are separated by read thresholds identified by the dashed lines and arrows 204. There are two thresholds 204 on the first page 202 and thus, only two reads for the first page 202. There are also two bits per cell on the first page 202. Based upon the layout of the first page 202, symbol "0" is found in area 206 and area 222. Symbol "1" is found in area 212 and area 216. The non-used area 214 is labeled with "X" at the physical locations of the grid (i.e., (2,2), (2,3), (3,2), (3,3)). Symbol "2" is found in area 208 and area 220. Symbol "3" is found in area 210 and area 218. As shown in FIG. 2A, location 275, which corresponds to the physical location of (1,3) on the grid, corresponds to symbol "1" for the first page 202.

The second page 250 has been divided into 16 areas that are separated by read thresholds identified by the dashed lines and arrows 252. There are three thresholds 252 on the second page 250 and thus, three reads for the second page. There are also three bits per cell on the second page 250. Based upon the layout of the second page 250, symbol "0" is found in area 260 and area 274. Symbol "1" can be found in area 266 and area 284. Symbol "2" can be found in area 264 and area 278. Symbol "3" can be found in area 254 and area 272. Symbol "4" can be found in area 276 and area 280. Symbol "5" can be found in area 270 and area 282. Symbol "6" can be found in area 256 and area 268. Symbol "7" can be found in area 258 and area 262. The non-used physical locations of the grid (i.e., (2,2), (2,3), (3,2), (3,3)) span areas 264, 266, 272 and 274. The location 275, which corresponds to the physical location of (1,3) on the grid, corresponds to symbol "2" for the second page 250.

FIG. 2C shows both the first page 202 and the second page 250 of the memory device 200 together so that the location 275, which corresponds to the physical location of (1,3) on the physical grid corresponds to symbol "1" for the first page 202 and "2" for the second page 250.

Figure 3A:
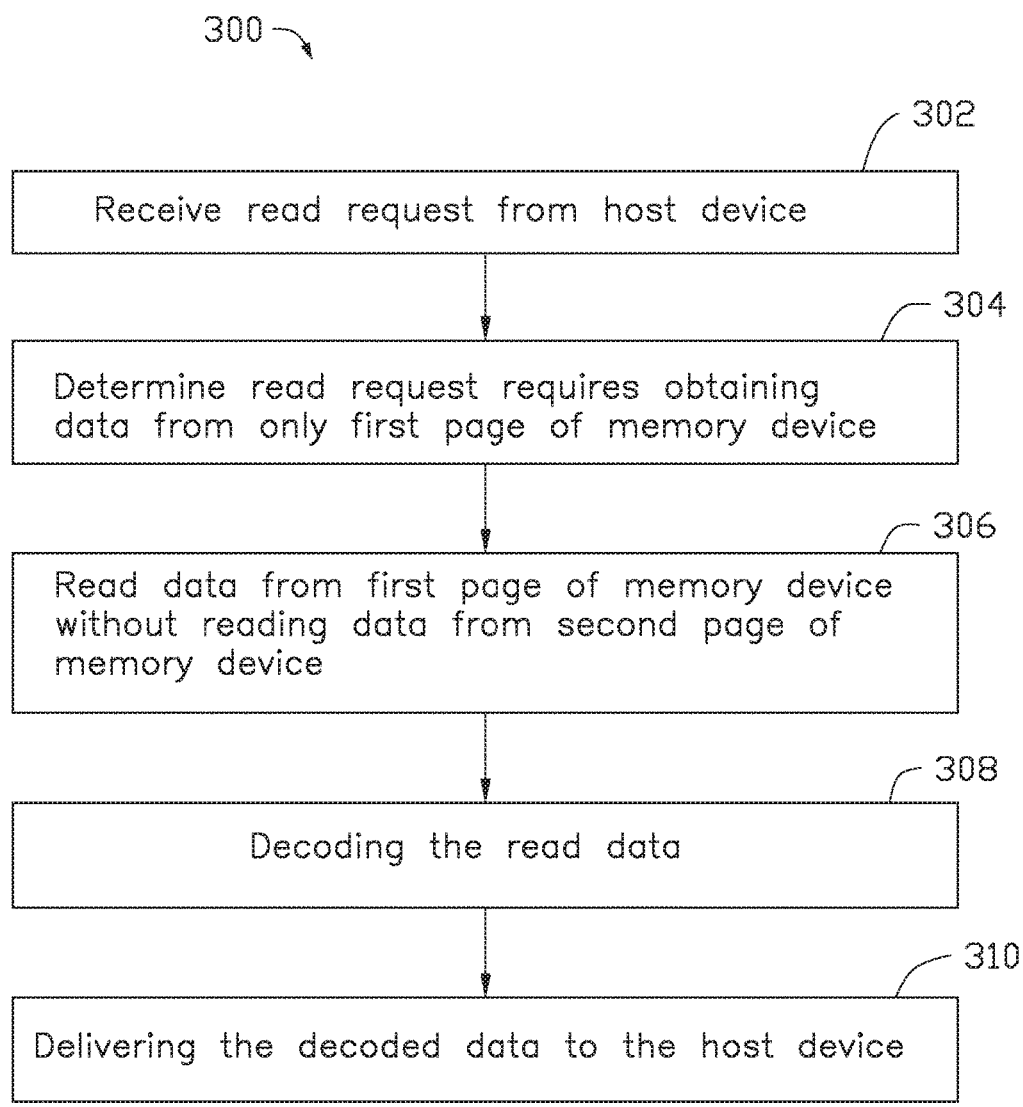
FIGS. 3A and 3B are flowcharts illustrating read processes for reading data from the memory device of FIG. 2C according to various embodiments.

FIG. 3A is a flowchart 300 illustrating a read process for reading data from the memory device 200 of FIG. 2C according to one embodiment. In the embodiment of FIG. 3A, only data from the first page 202 needs to be read. Hence, the memory system 104 receives the read request from the host device 102 in block 302. The scheduler 108 then determines not only which memory device 106 to read from (in this case, memory device 200), but also determines that the only data that is needed is from the first page 202 of the memory device 200 in block 304. The scheduler 108 also determines that the location 275 of the data to be obtained is (1,3). The data is then read from the first page 202 without reading any data from the second page 250 in block 306. The data that is read will have symbol "1". The read data will then be decoded in block 308 and then delivered to the host device 102 in block 310.

The first page 202 is a four input, five output channel having the following P(Y|X) table:

TABLE I

| P(Y\|X) | X = 0 | X = 1 | X = 2 | X = 3 |
|---|---|---|---|---|
| Y = 0 | 0.996 | 2.14E−04 | 2.14E−04 | 3.75E−41 |
| Y = 1 | 2.14E−04 | 0.996 | 9.20E−08 | 2.14E−04 |
| Y = 2 | 2.14E−04 | 9.20E−08 | 0.996 | 2.14E−04 |
| Y = 3 | 4.12E−41 | 2.14E−04 | 2.14E−04 | 0.996 |
| Y = erasure | 4.60E−08 | 2.14E−04 | 2.14E−04 | 4.60E−08 |

More information can be obtained by differentiating the same symbol in two regions as is done for Page 1 and turns the first page 202 into a four input, nine output channel.

Similarly, for page two 250, an eight input, eight output channel has the following P(Y|X) table:

TABLE II

| P(Y\|X) | X = 0 | X = 1 | X = 2 | X = 3 | X = 4 | X = 5 | X = 6 | X = 7 |
|---|---|---|---|---|---|---|---|---|
| Y = 0 | 0.992 | 1.07E−04 | 2.68E−27 | 1.07E−04 | 2.15E−04 | 2.74E−04 | 1.07E−04 | 1.07E−04 |
| Y = 1 | 1.07E−04 | 0.9991 | 1.07E−04 | 2.45E−27 | 6.35E−02 | 1.07E−04 | 2.14E−04 | 2.14E−04 |
| Y = 2 | 1.63E−27 | 1.07E−04 | 0.9992 | 1.07E−04 | 6.49E−05 | 6.49E−05 | 2.14E−04 | 2.74E−04 |
| Y = 3 | 1.07E−04 | 1.63E−27 | 1.07E−04 | 0.9993 | 2.74E−04 | 2.74E−04 | 6.49E−05 | 1.07E−04 |
| Y = 4 | 2.14E−04 | 1.37E−04 | 1.37E−04 | 1.30E−04 | 9.99E−01 | 1.07E−04 | 1.07E−04 | 2.62E−66 |
| Y = 5 | 1.30E−04 | 1.07E−04 | 1.37E−04 | 1.30E−04 | 1.07E−04 | 9.99E−01 | 8.68E−67 | 1.07E−04 |
| Y = 6 | 1.07E−04 | 2.14E−04 | 2.14E−04 | 1.37E−04 | 1.07E−04 | 8.18E−28 | 9.99E−01 | 1.07E−04 |
| Y = 7 | 1.07E−04 | 2.14E−04 | 1.30E−04 | 1.07E−04 | 4.95E−28 | 1.07E−04 | 1.07E−04 | 9.99E−01 |

Similar to Table I, more information can be obtained by differentiating the same symbol in two regions and turning into an eight input, sixteen output channel.

Decoding with non-binary ECCs is far better than using binary ECCs as shown in Table III where the ECC rate for the first page 202 is 0.9385 for non-binary whereas binary ECC rate for equal data would be 0.9048 and equal length would be 0.8711. Similarly, for the second page 250, the non-binary ECC rate is 0.9492 whereas the binary ECC rate is 0.8587 for equal data and 0.7949 for equal length. An ECC rate of 0.9 or greater is generally considered to be decodable. Thus, binary decoding the second page 250 would not be possible. Therefore, non-binary ECC decoding provides better results than binary ECC decoding.

TABLE III

|  | rber | $N = q^m - 1$ | t | #parity ≤ 2mt | rate |
|---|---|---|---|---|---|
| Page 1 | | | | | |
| Non-binary | 4.83E−04 | 4095 | 21 | 252 | 0.9385 |
| Binary (eq. data) | 5.36E−04 | 8191 | 30 | 780 | 0.9048 |
| binary (eq. length) | 5.36E−04 | 4095 | 22 | 528 | 0.8711 |
| Page 2 | | | | | |
| Non-binary | 8.39E−04 | 4095 | 26 | 208 | 0.9492 |
| Binary (eq. data) | 1.51E−03 | 12287 | 62 | 1736 | 0.8587 |
| binary (eq. length) | 1.51E−03 | 4095 | 35 | 840 | 0.7949 |

Figure 3B:
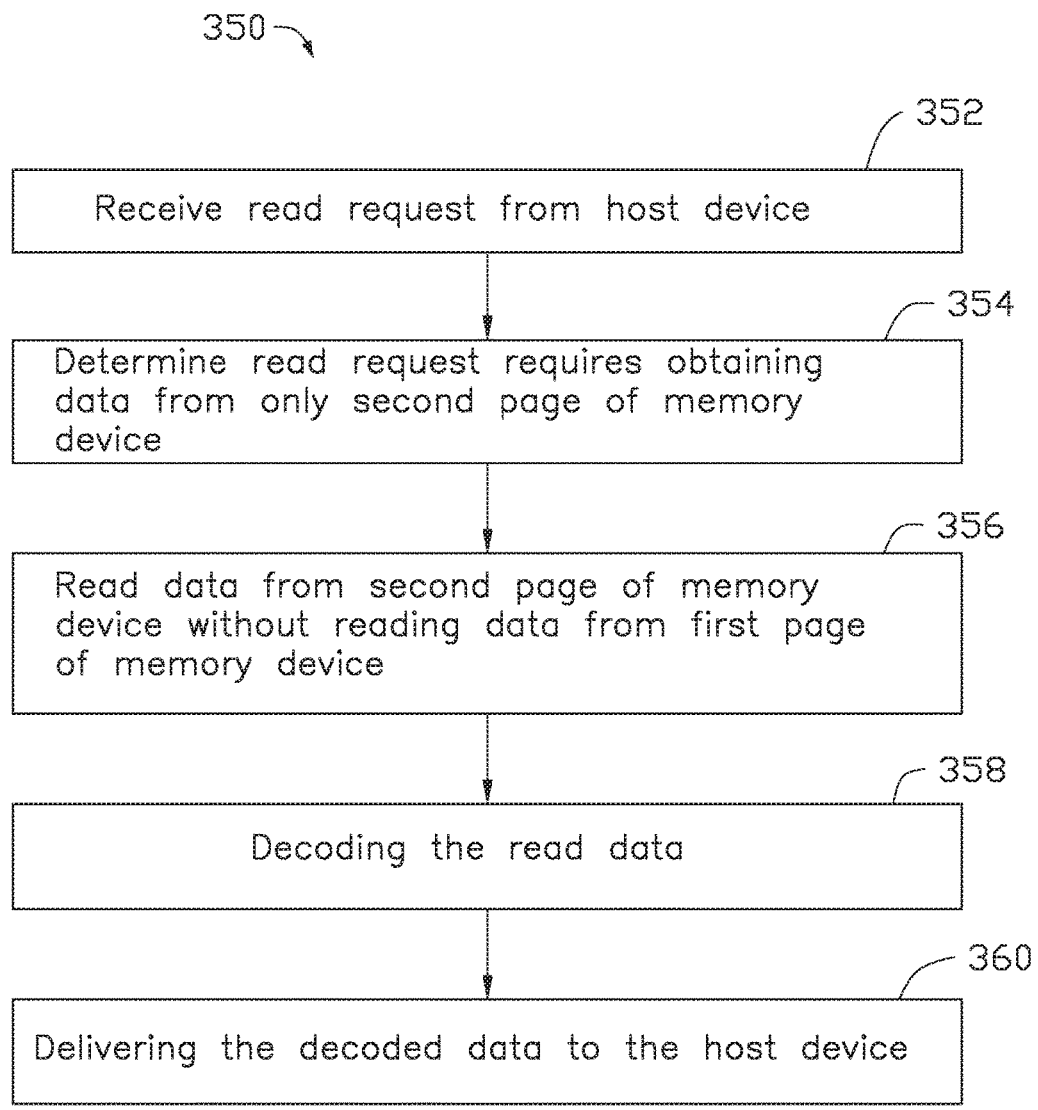

FIG. 3B is a flowchart 350 illustrating a read process for reading data from the memory device 200 of FIG. 2C according to one embodiment. In the embodiment of FIG. 3B, only data from the second page 250 needs to be read. Hence, the memory system 104 receives the read request from the host device 102 in block 352. The scheduler 108 then determines not only which memory device 106 to read from (in this case, memory device 200), but also determines that the only data that is needed is from the second page 250 of the memory device 200 in block 354. The scheduler 108 also determines that the location 275 of the data to be obtained is (1,3). The data is then read from the second page 250 without reading any data from the first page 202 in block 356. The data that is read will have symbol "2". The read data will then be decoded in block 358 and then delivered to the host device 102 in block 360.

The decoding is much more reliable in non-binary ECC situations because the only possible error is a symbol error. Because of the mapping of the various pages, the symbols for the various areas that have been mapped are easily known because all of the symbols within a common area are identical.

Figure 4A:
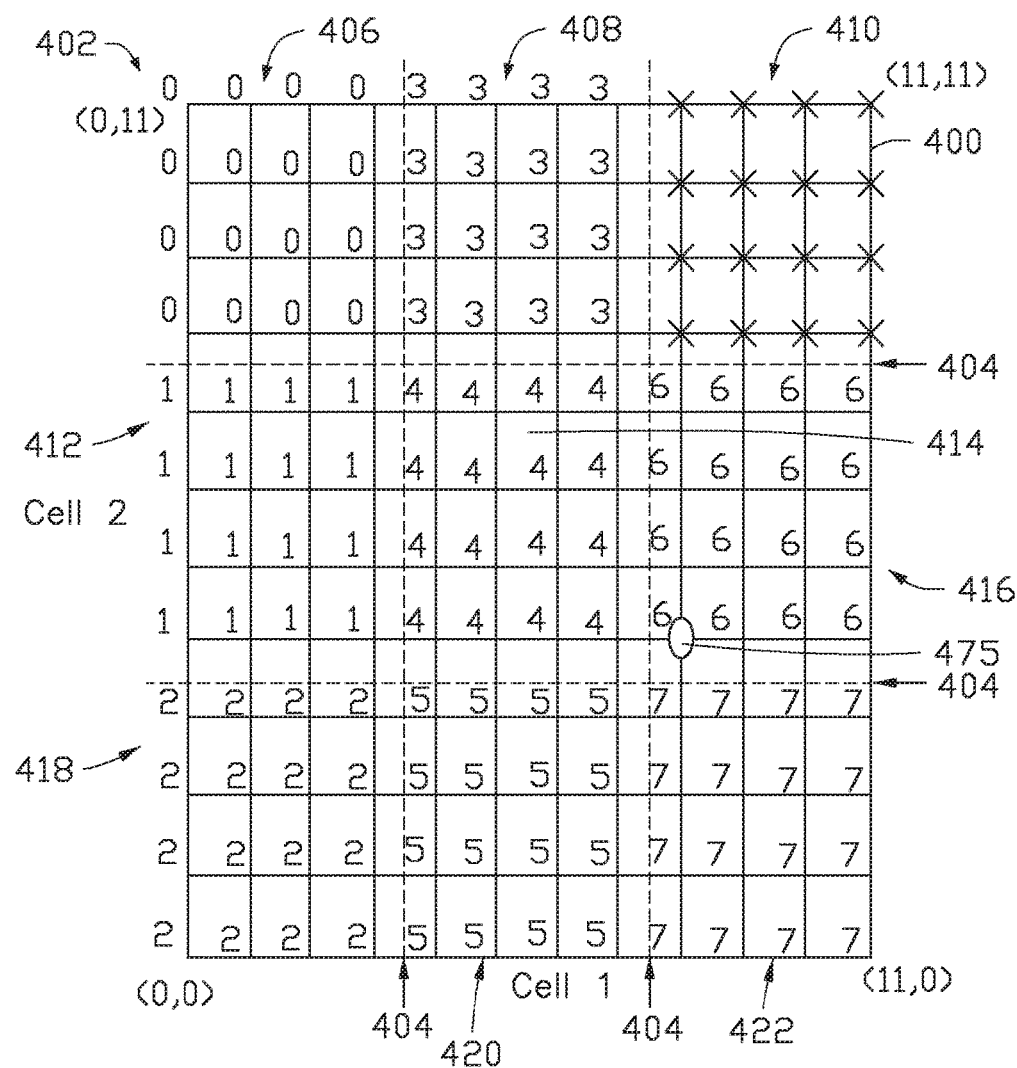
FIG. 4A is a schematic illustration of a first page of a twelve level memory device according to one embodiment.
Figure 4B:
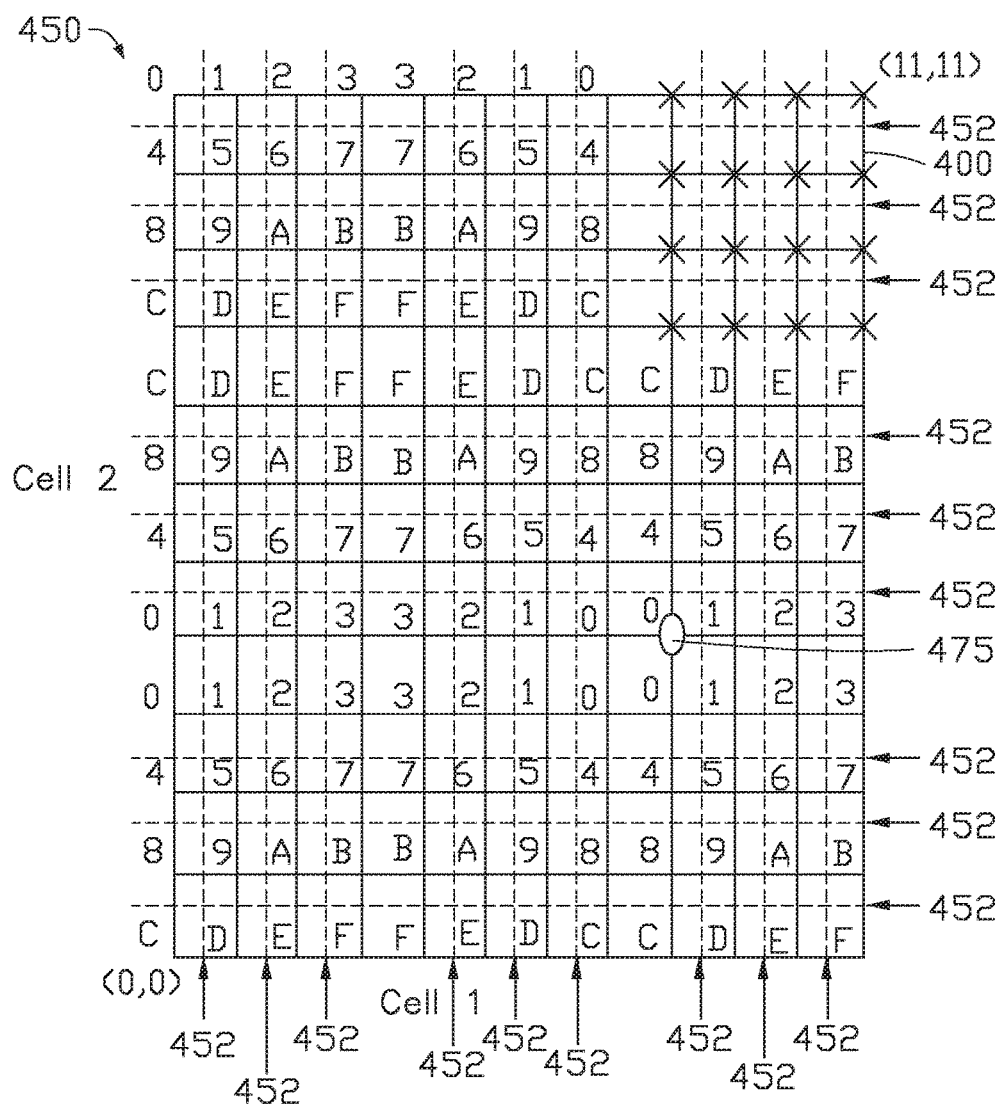
FIG. 4B is a schematic illustration of a second page of the twelve level memory device of FIG. 4A.
Figure 4C:
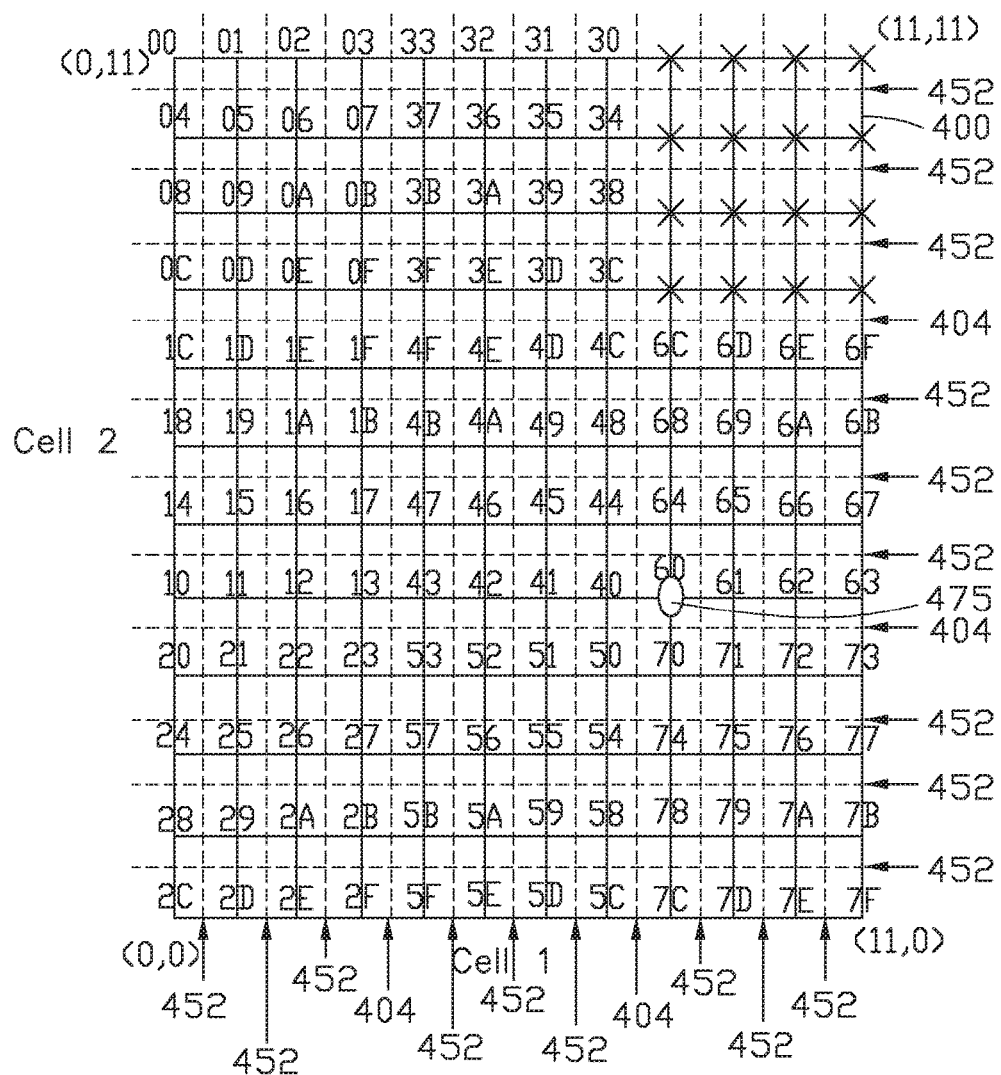
FIG. 4C is a schematic illustration of the twelve level memory device of FIGS. 4A and 4B with both pages.

FIG. 4A is a schematic illustration of a first page of a twelve level memory device 400 according to one embodiment. FIG. 4B is a schematic illustration of a second page of the twelve level memory device of FIG. 4A. FIG. 4C is a schematic illustration of the twelve level memory device of FIGS. 4A and 4B with both pages. As can be seen in FIG. 4A, the first page 402 has a physical layout of a 12×12 grid with two cells. The first page 402 has 8 possible symbols (i.e., 0, 1, 2, 3, 4, 5, 6 or 7). As will be discussed below with regards to FIG. 4B, the second page 450 has sixteen possible symbols (i.e., 0, 1, 2, 3, 4, 5, 6, 7, 8, 9, A, B, C, D, E or F). Thus, there are 144 points for the memory device 400. While there are 144 points, there are only 128 possible points to use because the number of possible points equals the number of possible symbols for the first page times the number of possible symbols for the second page. Therefore, sixteen point locations are not utilized on the first page 402 or second page 450. The non-used locations correspond to the same physical location identified by an "X" on FIGS. 4A-4C.

The first page 402 has been divided into 9 areas that are separated by read thresholds 404 identified by the dashed lines and arrows. There are two thresholds 404 on the first page 402 and thus, only two reads for the first page 402. There are also three bits per cell on the first page 402. Based upon the layout of the first page 402, symbol "0" is found in area 406. Symbol "1" is found in area 412. The non-used area 410 is labeled with "X" at the physical locations of the grid (i.e., (8,8), (8,9), (8,10), (8,11), (9,8), (9,9), (9,10), (9,11), (10,8), (10,9), (10,10), (10,11), (11,8), (11,9), (11,10) and (11,11)). Symbol "2" is found in area 418. Symbol "3" is found in area 408. Symbol "4" is found in area 414. Symbol "5" is found in area 420. Symbol "6" is found in area 416, and symbol "7" is found in area 422. As shown in FIG. 4A, location 475, which corresponds to the physical location of (8,4) on the grid, corresponds to symbol "6" for the first page 402.

The second page 450 has been divided into 100 areas that are separated by read thresholds identified by the dashed lines and arrows 452. There are nine thresholds 452 on the second page 450 and thus, nine reads for the second page 450. There are also four bits per cell on the second page 450. Based upon the layout of the second page 450, the symbols are found in multiple areas. For location 475 at physical location (8,4) on the grid, the corresponding symbol is "0".

FIG. 4C shows both the first page 402 and the second page 450 of the memory device 400 together so that the location 475, which corresponds to the physical location of (8,4) on the physical grid corresponds to symbol "6" for the first page 402 and "0" for the second page 450.

Figure 5:
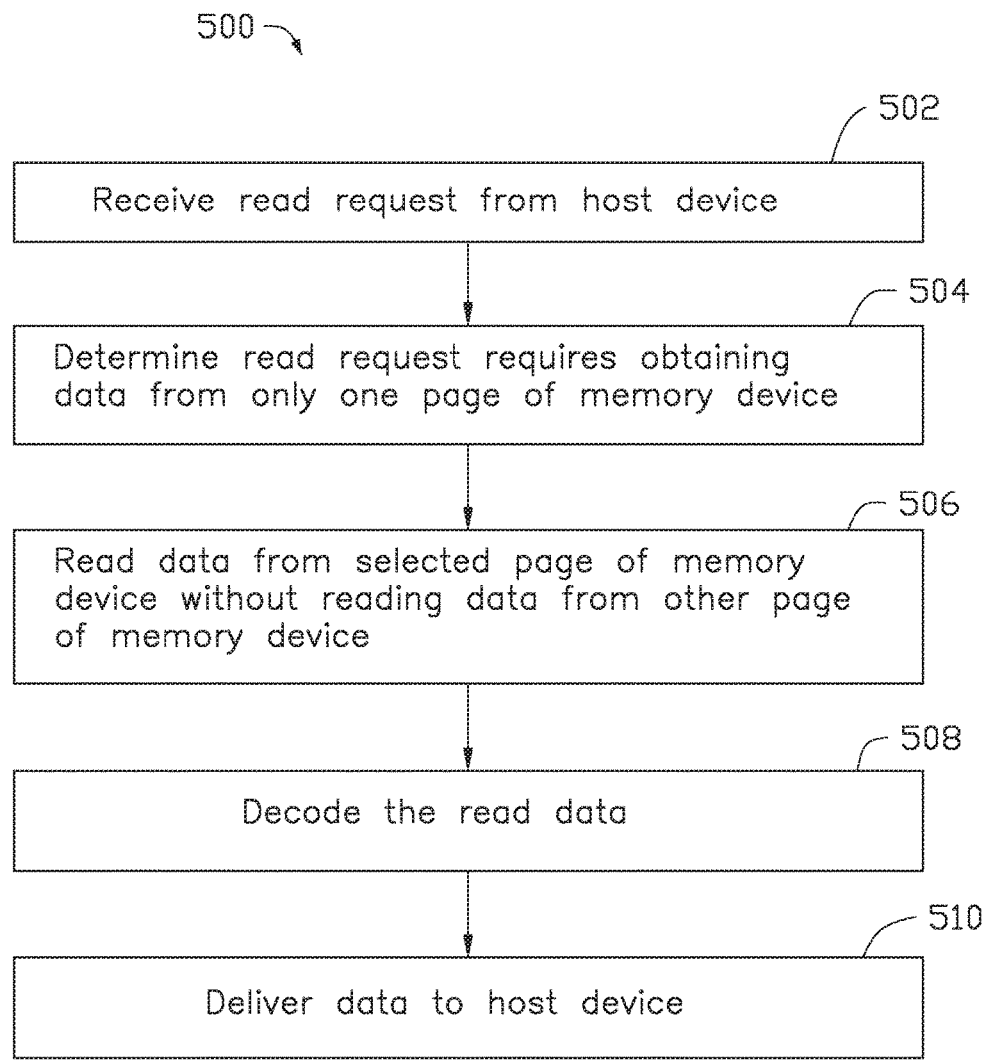
FIG. 5 is a flowchart illustrating a read process for reading data from the memory device of FIG. 4C according to one embodiment.

FIG. 5 is a flowchart 500 illustrating a read process for reading data from the memory device of FIG. 4C according to one embodiment. In the embodiment of FIG. 5, only data from either the first page 402 or the second page 450 needs to be read. Hence, the memory system 104 receives the read request from the host device 102 in block 502. The scheduler 108 then determines not only which memory device 106 to read from (in this case, memory device 400), but also determines that the only data that is needed is from either the first page 402 of the memory device 200 or the second page 450 of the memory device 200 in block 504. The scheduler 108 also determines that the location 475 of the data to be obtained is (8,4). The data is then read from the selected page without reading any data from the non-selected page in block 506. The read data will then be decoded in block 508 and then delivered to the host device 102 in block 510.

Figure 6A:
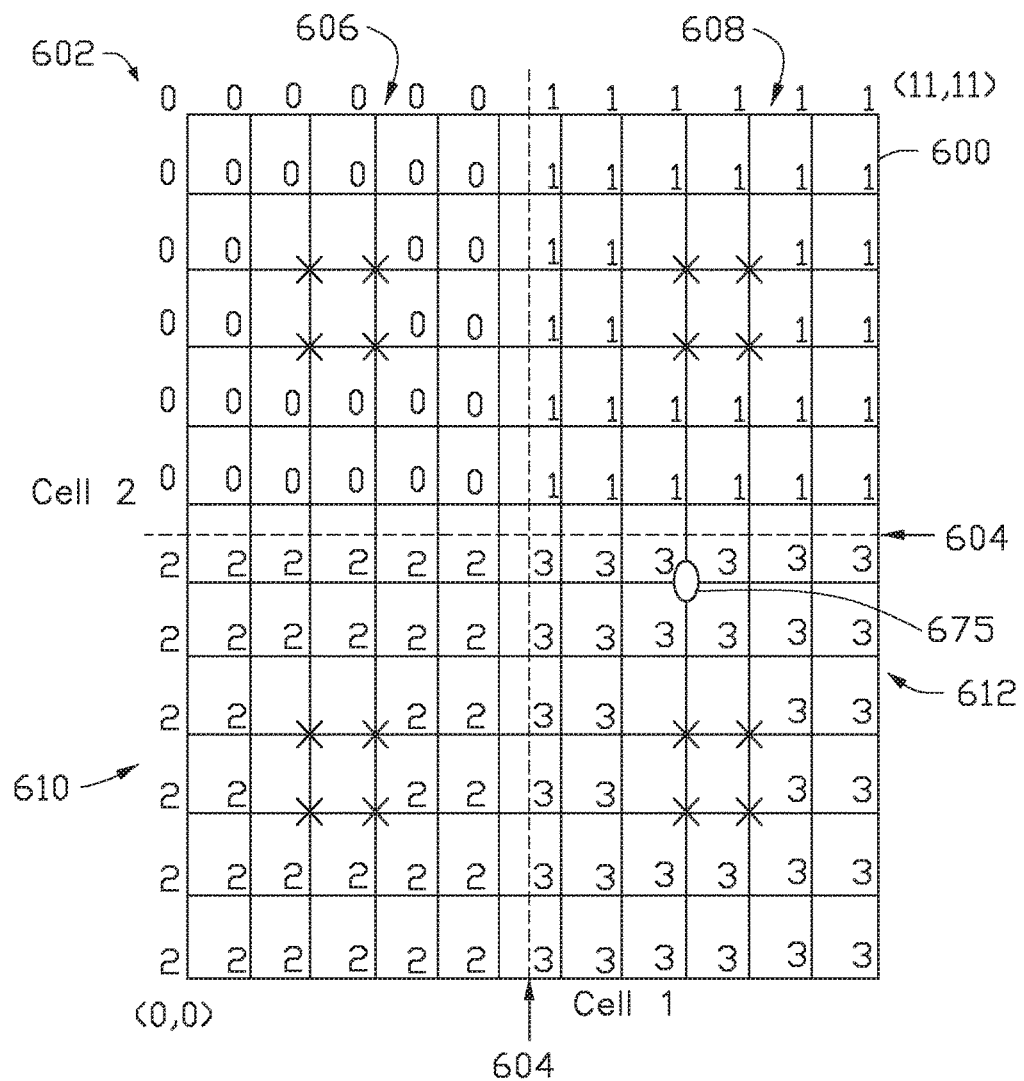
FIG. 6A is a schematic illustration of a first page of a twelve level memory device according to one embodiment.
Figure 6B:
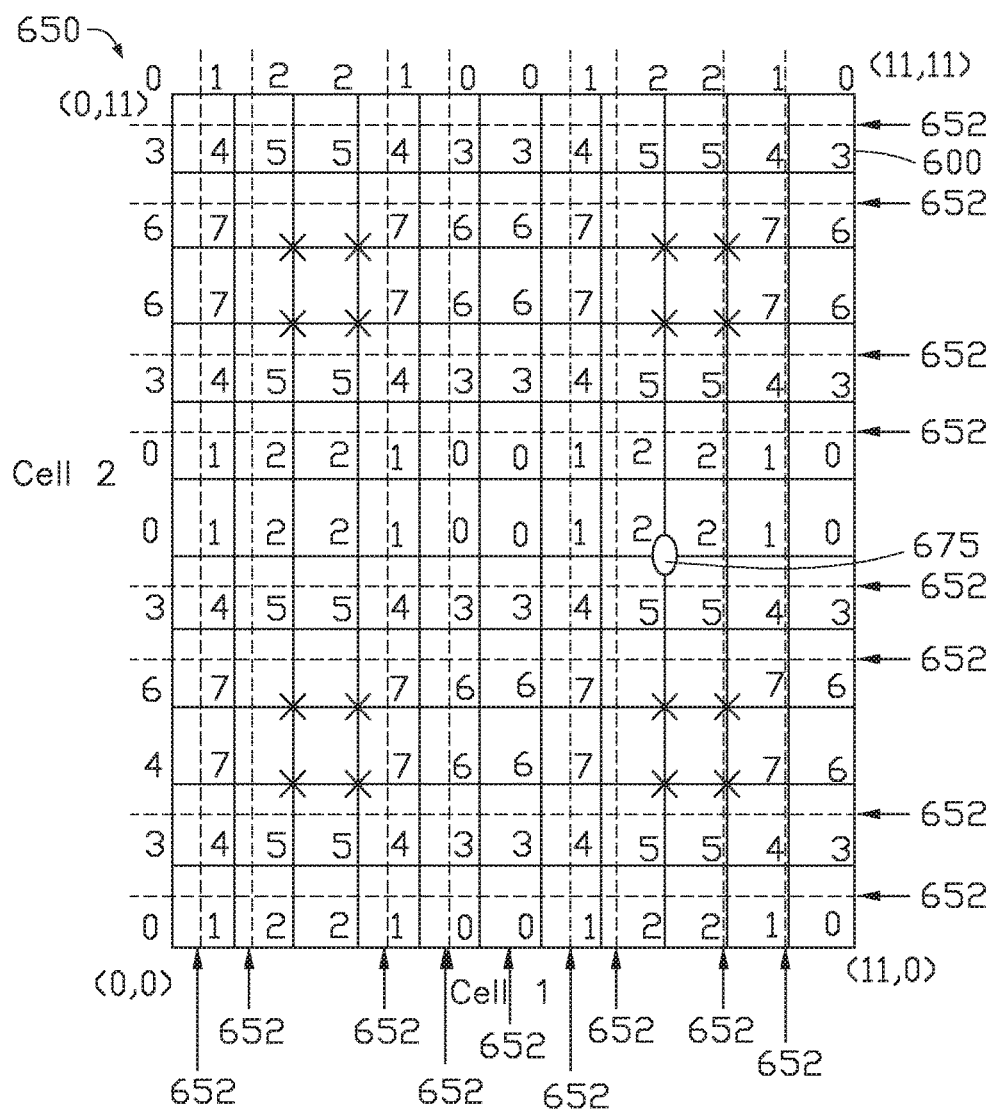
FIG. 6B is a schematic illustration of a second page of the twelve level memory device of FIG. 6A.
Figure 6C:
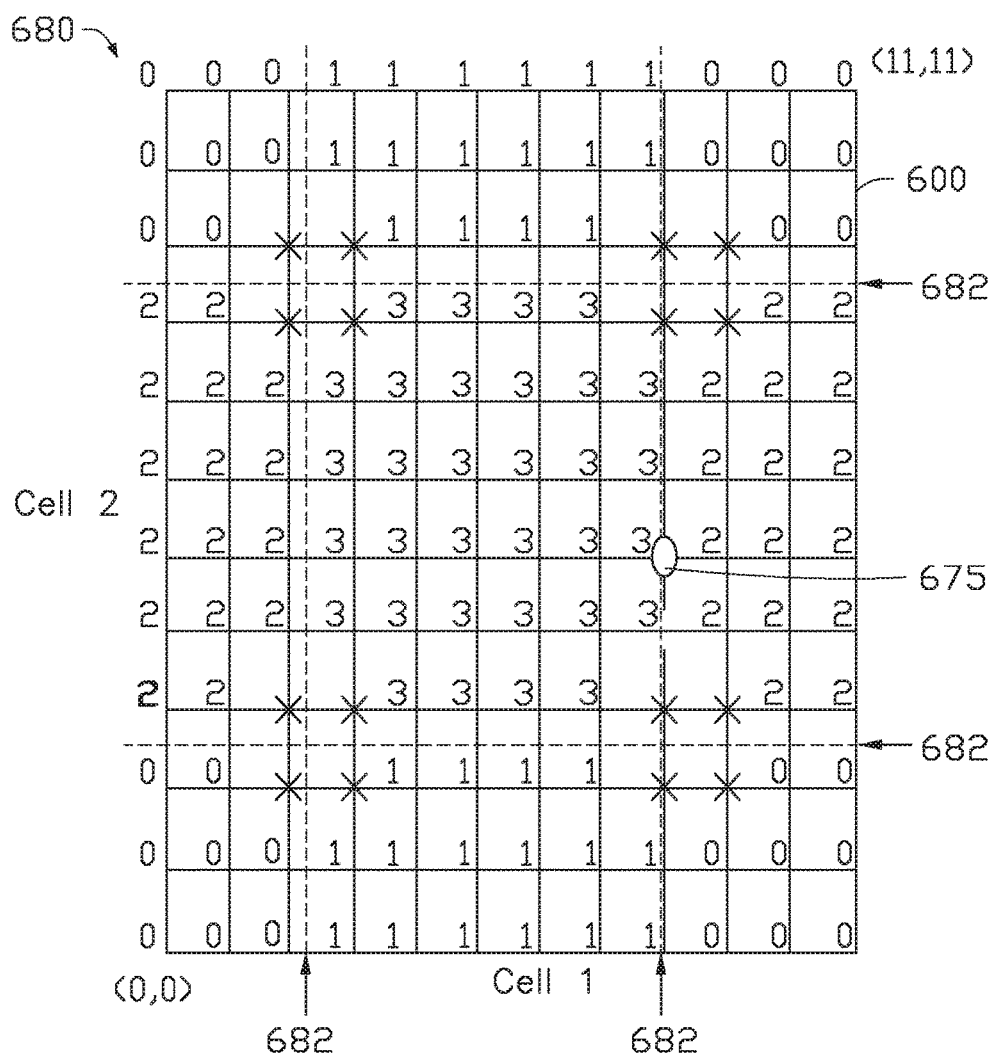
FIG. 6C is a schematic illustration of a third page of the twelve level memory device of FIG. 6A.
Figure 6D:
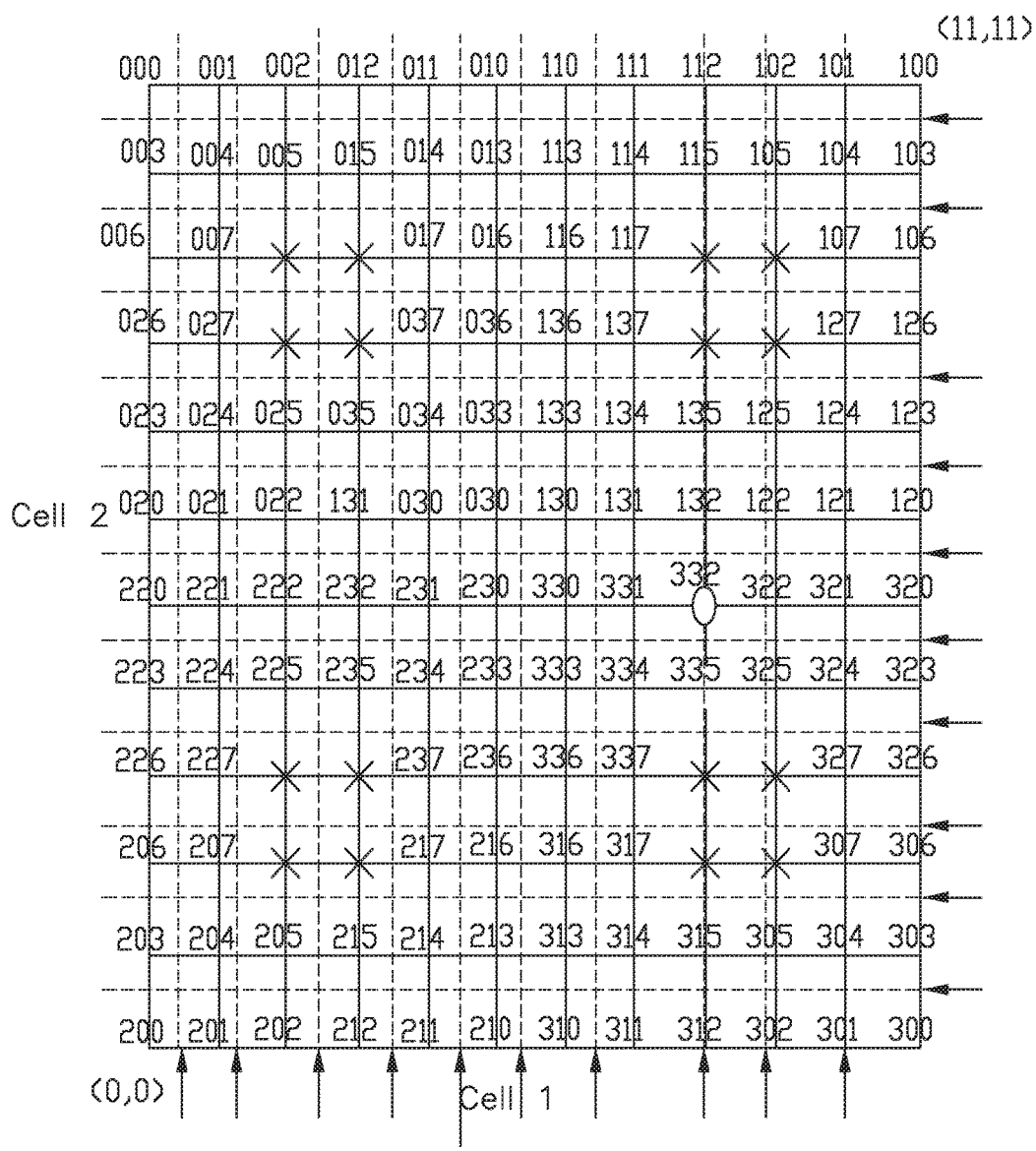
FIG. 6D is a schematic illustration of the twelve level memory device of FIGS. 6A-6C with all three pages.

FIG. 6A is a schematic illustration of a first page 602 of a twelve level memory device 600 according to one embodiment. FIG. 6B is a schematic illustration of a second page 650 of the twelve level memory device 600 of FIG. 6A. FIG. 6C is a schematic illustration of a third page 680 of the twelve level memory device 600 of FIG. 6A. FIG. 6D is a schematic illustration of the twelve level memory device 600 of FIGS. 6A-6C with all three pages. As can be seen in FIG. 6A, the first page 602 has a physical layout of a 12×12 grid with two cells. The first page 602 has 4 possible symbols (i.e., 0, 1, 2 or 3). As will be discussed below with regards to FIG. 6B, the second page 650 has four possible symbols (i.e., 0, 1, 2 or 3). As will be discussed below with regards to FIG. 6C, the third page 680 has eight possible symbols (i.e., 0, 1, 2, 3, 4, 5, 6 or 7). Thus, there are 144 points for the memory device 400. While there are 144 points, there are only 128 possible points to use because the number of possible points equals the number of possible symbols for the first page times the number of possible symbols for the second page times the number of possible symbols for the third page 680. Therefore, sixteen point locations are not utilized on the first page 602, second page 650 or third page 680. The non-used locations correspond to the same physical location identified by an "X" on FIGS. 6A-6D.

The first page 602 has been divided into four areas that are separated by read thresholds identified by the dashed lines and arrows 604. There is one threshold 604 on the first page 602 and thus, only one read for the first page 602. There are also two bits per cell on the first page 602. Based upon the layout of the first page 602, symbol "0" is found in area 606. Symbol "1" is found in area 608. The non-used area is labeled with "X" at the physical locations of the grid (i.e., (2,2), (2,3), (2,8), (2,9), (3,2), (3,3), (3,8), (3,9), (8,2), (8,3), (8,8), (8,9), (9,2), (9,3), (9,8) and (9,9)). Symbol "2" is found in area 610. Symbol "3" is found in area 612. As shown in FIG. 6A, location 675, which corresponds to the physical location of (8,5) on the grid, corresponds to symbol "3" for the first page 602.

The second page 650 has been divided into 81 areas that are separated by read thresholds identified by the dashed lines and arrows 652. There are eight thresholds 652 on the second page 650 and thus, eight reads for the second page 650. There are also three bits per cell on the second page 650. Based upon the layout of the second page 650, the symbols are found in multiple areas. For location 675 at physical location (8,5) on the grid, the corresponding symbol is "2".

The third page 680 has been divided into nine areas that are separated by read thresholds identified by the dashed lines and arrows 682. There are two thresholds 682 on the third page 680 and thus, two reads for the third page 680. There are also two bits per cell on the third page 680. Based upon the layout of the third page 680, the symbols are found in multiple areas. For location 675 at physical location (8,5) on the grid, the corresponding symbol is "2".

FIG. 6D shows the first page 602, the second page 650 and the third page 680 of the memory device 600 together so that the location 675, which corresponds to the physical location of (8,5) on the physical grid corresponds to symbol "3" for the first page 602, "2" for the second page 650 and "2" for the third page 680.

Figure 7:
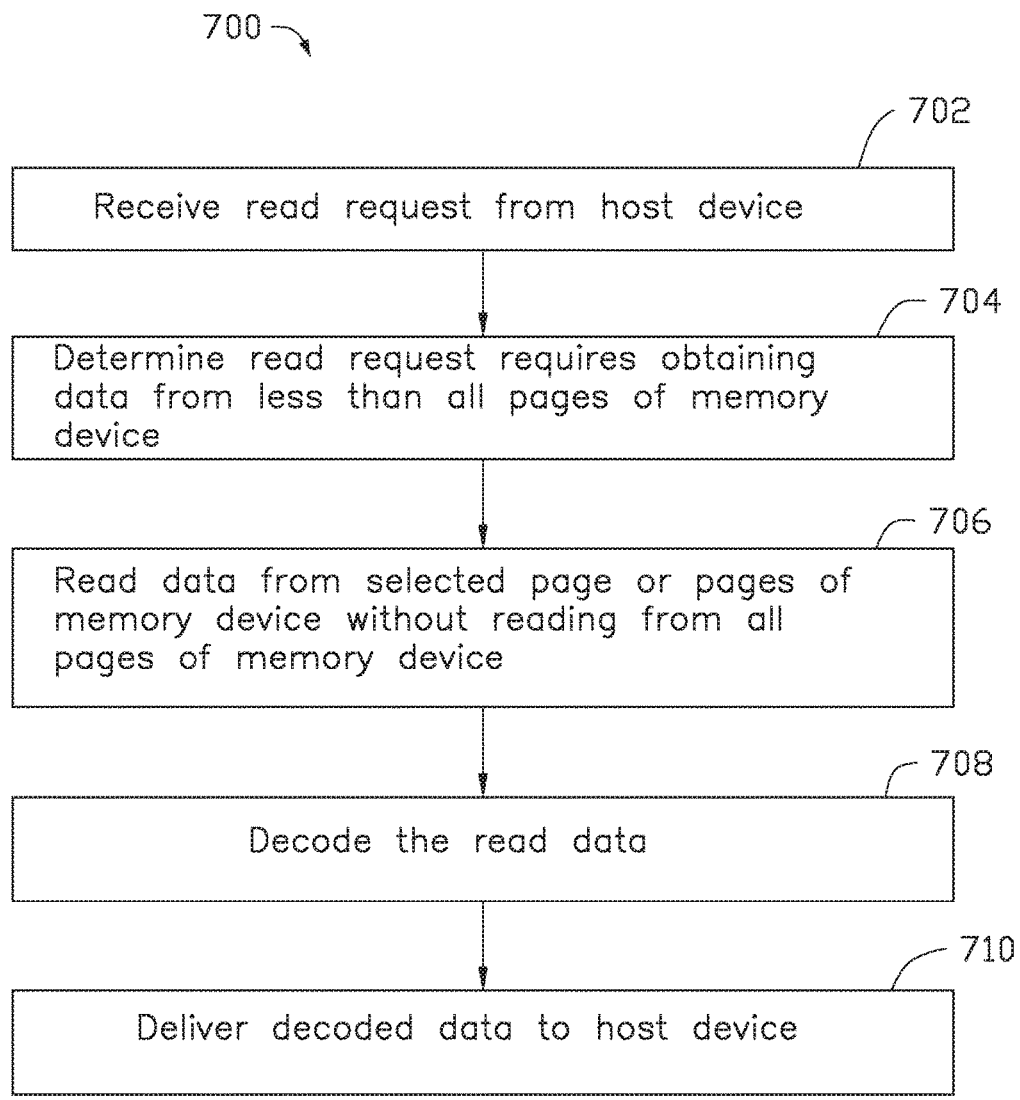
FIG. 7 is a flowchart illustrating a read process for reading data from the memory device of FIG. 6D according to one embodiment.

FIG. 7 is a flowchart illustrating a read process for reading data from the memory device of FIG. 6D according to one embodiment. In the embodiment of FIG. 7, only data from less than all of the first page 602, the second page 650 and the third page 680 needs to be read. In other words, either a single page or two pages are to be read, but not all three pages are to be read. Hence, the memory system 104 receives the read request from the host device 102 in block 702. The scheduler 108 then determines not only which memory device 106 to read from (in this case, memory device 400), but also determines that the only data that is needed is from either the first page 602 of the memory device 600, the second page 650 of the memory device 600, the third page 680 of the memory device 600 or a combination of two pages of the memory device 600 (but not all three pages of the memory device 600) in block 704. The scheduler 108 also determines that the location 675 of the data to be obtained is (8,5). The data is then read from the selected page without reading any data from the non-selected page(s) in block 706. The read data will then be decoded in block 708 and then delivered to the host device 102 in block 710.

By using fractional bits, non-binary ECCs increase the data reliability because only the symbol could be an error rather than a bit error. Additionally, the read latency is reduced because less than all of the memory cell needs to be read. Instead of reading the entire cell, only the page with the data needs to be read.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
   receiving a read request at a memory device from a host device that is coupled to the memory device, wherein:
      the memory device is a multiple level storage device having a plurality of memory cells;
      each memory cell has a plurality of pages with each page corresponding to a different level of the multiple level storage device; and
      each page has a different number of read thresholds per page;
   determining that the read request involves reading information from less than all pages of a first memory cell;

reading information from less than all pages of the first memory cell;
decoding the read information using non-binary error correction codes (ECCs); and
delivering the decoded information to the host device.

2. A method, comprising:
receiving a read request at a memory device from a host device that is coupled to the memory device, wherein:
the memory device is a multiple level storage device having a plurality of memory cells; and
each memory cell has a plurality of pages with each page corresponding to a different level of the multiple level storage device;
determining that the read request involves reading information from less than all pages of a first memory cell;
reading information from less than all pages of the first memory cell;
decoding the read information using non-binary error correction codes (ECCs); and
delivering the decoded information to the host device,
wherein the memory device is a twelve level device having two cells having two pages and a different number of read thresholds per page and wherein the reading comprises reading less than eleven thresholds.

3. The method of claim 2, wherein an average reads per page to read the information from the first memory cell is 5.5 reads per page, a first page of the two pages has 1.5 bits per cell and a second page of the two pages has 2 bits per cell.

4. A method, comprising:
receiving a read request at a memory device from a host device that is coupled to the memory device, wherein:
the memory device is a multiple level storage device having a plurality of memory cells; and
each memory cell has a plurality of pages with each page corresponding to a different level of the multiple level storage device;
determining that the read request involves reading information from less than all pages of a first memory cell;
reading information from less than all pages of the first memory cell;
decoding the read information using non-binary error correction codes (ECCs); and
delivering the decoded information to the host device,
wherein the memory device is a twelve level device having two cells having three pages and a different number of read thresholds per page and wherein the reading comprises reading less than eleven thresholds.

5. The method of claim 4, wherein an average reads per page to read the information from the first memory cell is 3.67 reads per page, a first page of the three pages has 1 bit per cell and a second page of the three pages has 1 bit per cell and a third page of the three pages has 1.5 bits per cell.

6. A method, comprising:
receiving a read request at a memory device from a host device that is coupled to the memory device, wherein:
the memory device is a multiple level storage device having a plurality of memory cells; and
each memory cell has a plurality of pages with each page corresponding to a different level of the multiple level storage device;
determining that the read request involves reading information from less than all pages of a first memory cell;
reading information from less than all pages of the first memory cell;
decoding the read information using non-binary error correction codes (ECCs); and
delivering the decoded information to the host device,
wherein the memory device is a six level device having two cells having two pages and a different number of read thresholds per page and wherein the reading comprises reading less than five thresholds.

7. The method of claim 6, wherein an average reads per page to read the information from the first memory cell is 2.5 reads per page, a first page of the two pages has 1 bit per cell and a second page of the two pages has 1.5 bits per cell.

8. A computer system for storing and retrieving data, comprising:
a scheduler; and
a memory storing instructions that, when executed by the scheduler, cause the computer system to:
receive a read request at a memory device from a host device that is coupled to the memory device, wherein:
the memory device is a multiple level storage device having a plurality of memory cells;
each memory cell has a plurality of pages with each page corresponding to a different level of the multiple level storage device; and
each page has a different number of read thresholds per page;
determine that the read request involves reading information from less than all pages of a first memory cell;
read information from less than all pages of the first memory cell;
decode the read information using non-binary error correction codes (ECCs); and
deliver the decoded information to the host device.

9. A computer system for storing and retrieving data, comprising:
a scheduler; and
a memory storing instructions that, when executed by the scheduler, cause the computer system to:
receive a read request at a memory device from a host device that is coupled to the memory device, wherein:
the memory device is a multiple level storage device having a plurality of memory cells;
each memory cell has a plurality of pages with each page corresponding to a different level of the multiple level storage device; and
each page has a different number of read thresholds per page;
determine that the read request involves reading information from less than all pages of a first memory cell;
read information from less than all pages of the first memory cell;
decode the read information using non-binary error correction codes (ECCs); and
deliver the decoded information to the host device,
wherein the memory device is a twelve level device having two cells having two pages and a different number of read thresholds per page and wherein the reading comprises reading less than eleven thresholds.

10. The computer system of claim 9, wherein an average reads per page to read the information from the first memory cell is 5.5 reads per page, a first page of the two pages has 1.5 bits per cell and a second page of the two pages has 2 bits per cell.

11. A computer system for storing and retrieving data, comprising:
a scheduler; and a memory storing instructions that, when executed by the scheduler, cause the computer system to:
receive a read request at a memory device from a host device that is coupled to the memory device, wherein:
the memory device is a multiple level storage device having a plurality of memory cells;
each memory cell has a plurality of pages with each page corresponding to a different level of the multiple level storage device; and
each page has a different number of read thresholds per page;
determine that the read request involves reading information from less than all pages of a first memory cell;
read information from less than all pages of the first memory cell;
decode the read information using non-binary error correction codes (ECCs); and
deliver the decoded information to the host device,
wherein the memory device is a twelve level device having two cells having three pages and a different number of read thresholds per page and wherein the reading comprises reading less than eleven thresholds.

12. The computer system of claim 11, wherein an average reads per page to read the information from the first memory cell is 3.67 reads per page, a first page of the three pages has 1 bit per cell and a second page of the three pages has 1 bit per cell and a third page of the three pages has 1.5 bits per cell.

13. A computer system for storing and retrieving data, comprising:
a scheduler; and
a memory storing instructions that, when executed by the scheduler, cause the computer system to:
receive a read request at a memory device from a host device that is coupled to the memory device, wherein:
the memory device is a multiple level storage device having a plurality of memory cells;
each memory cell has a plurality of pages with each page corresponding to a different level of the multiple level storage device; and
each page has a different number of read thresholds per page;
determine that the read request involves reading information from less than all pages of a first memory cell;
read information from less than all pages of the first memory cell;
decode the read information using non-binary error correction codes (ECCs); and
deliver the decoded information to the host device,
wherein the memory device is a six level device having two cells having two pages and a different number of read thresholds per page and wherein the reading comprises reading less than five thresholds.

14. The computer system of claim 13, wherein an average reads per page to read the information from the first memory cell is 2.5 reads per page, a first page of the two pages has 1 bit per cell and a second page of the two pages has 1.5 bits per cell.

15. A non-transitory computer readable storage medium containing instructions that, when executed by a scheduler, performs the following method:
receive a read request at a memory device from a host device that is coupled to the memory device, wherein:
the memory device is a multiple level storage device having a plurality of memory cells;
each memory cell has a plurality of pages with each page corresponding to a different level of the multiple level storage device; and
each page has a different number of read thresholds per page;
determine that the read request involves reading information from less than all pages of a first memory cell;
read information from less than all pages of the first memory cell;
decoding the read information using non-binary error correction codes (ECCs); and
deliver the decoded information to the host device.

16. A non-transitory computer readable storage medium containing instructions that, when executed by a scheduler, performs the following method:
receive a read request at a memory device from a host device that is coupled to the memory device, wherein:
the memory device is a multiple level storage device having a plurality of memory cells; and
each memory cell has a plurality of pages with each page corresponding to a different level of the multiple level storage device;
determine that the read request involves reading information from less than all pages of a first memory cell;
read information from less than all pages of the first memory cell;
decoding the read information using non-binary error correction codes (ECCs); and
deliver the decoded information to the host device,
wherein the memory device is a twelve level device having two cells having two pages and a different number of read thresholds per page and wherein the reading comprises reading less than eleven thresholds.

17. The non-transitory computer readable storage medium of claim 16, wherein an average reads per page to read the information from the first memory cell is 5.5 reads per page, a first page of the two pages has 1.5 bits per cell and a second page of the two pages has 2 bits per cell.

18. A non-transitory computer readable storage medium containing instructions that, when executed by a scheduler, performs the following method:
receive a read request at a memory device from a host device that is coupled to the memory device, wherein:
the memory device is a multiple level storage device having a plurality of memory cells; and
each memory cell has a plurality of pages with each page corresponding to a different level of the multiple level storage device;
determine that the read request involves reading information from less than all pages of a first memory cell;
read information from less than all pages of the first memory cell;
decoding the read information using non-binary error correction codes (ECCs); and
deliver the decoded information to the host device,
wherein the memory device is a twelve level device having two cells having three pages and a different number of read thresholds per page and wherein the reading comprises reading less than eleven thresholds.

19. The non-transitory computer readable storage medium of claim 18, wherein an average reads per page to read the information from the first memory cell is 3.67 reads per page, a first page of the three pages has 1 bit per cell and a second page of the three pages has 1 bit per cell and a third page of the three pages has 1.5 bits per cell.

20. A non-transitory computer readable storage medium containing instructions that, when executed by a scheduler, performs the following method:
    receive a read request at a memory device from a host device that is coupled to the memory device, wherein:
        the memory device is a multiple level storage device having a plurality of memory cells; and
        each memory cell has a plurality of pages with each page corresponding to a different level of the multiple level storage device;
    determine that the read request involves reading information from less than all pages of a first memory cell;
    read information from less than all pages of the first memory cell;
    decoding the read information using non-binary error correction codes (ECCs); and
    deliver the decoded information to the host device,
    wherein the memory device is a six level device having two cells having two pages and a different number of read thresholds per page and wherein the reading comprises reading less than five thresholds.

21. The non-transitory computer readable storage medium of claim 20, wherein an average reads per page to read the information from the first memory cell is 2.5 reads per page, a first page of the two pages has 1 bit per cell and a second page of the two pages has 1.5 bits per cell.

* * * * *